(12) United States Patent
Bielas

(10) Patent No.: US 6,359,918 B1
(45) Date of Patent: Mar. 19, 2002

(54) LIGHT SOURCE CONTROL DEVICE

(75) Inventor: Michael S. Bielas, Tucson, AZ (US)

(73) Assignee: Honeywell International Inc., Morristown, NJ (US)

(*) Notice: Subject to any disclaimer, the term of this patent is extended or adjusted under 35 U.S.C. 154(b) by 0 days.

(21) Appl. No.: 09/107,309

(22) Filed: Jun. 30, 1998

(51) Int. Cl.[7] .................................................. H01S 3/00
(52) U.S. Cl. ...................................... 372/38.01; 372/32
(58) Field of Search ............................ 356/350; 372/32, 372/38.01; 374/178

(56) References Cited

U.S. PATENT DOCUMENTS

| | | | |
|---|---|---|---|
| 5,024,535 A | | 6/1991 | Winston, Jr. |
| 5,329,349 A | * | 7/1994 | Patterson ................... 356/73.1 |
| 5,392,303 A | | 2/1995 | Shiozawa et al. |
| 5,410,515 A | | 4/1995 | Bielas et al. |
| 5,812,572 A | * | 9/1998 | King ........................... 372/38 |

FOREIGN PATENT DOCUMENTS

| | | |
|---|---|---|
| GB | 2 261 947 A | 6/1993 |
| JP | 61289366 | 12/1986 |
| JP | 02102589 | 4/1990 |
| JP | 04188782 | 11/1990 |
| JP | 03036777 | 2/1991 |
| JP | 05126586 | 11/1991 |
| JP | 05235448 | 1/1992 |
| JP | 04152582 | 5/1992 |

* cited by examiner

*Primary Examiner*—James W. Davie
*Assistant Examiner*—Gioacchino Inzirillo
(74) *Attorney, Agent, or Firm*—Marcus J. Thymian

(57) ABSTRACT

A light source controller having a look-up table that indicates the amount of current to be provided to a light source to maintain wavelength and spectrum stability at various temperatures. Further, the light source may have a heater/cooler to maintain a constant temperature of the light source. The controller provides the appropriate current to the light source from the time of turn-on until it achieves thermal equilibrium, to provide an output having a relatively constant wavelength during the warm-up period and during changes of ambient temperature about the light source. The light source may have a heater and/or cooler to maintain a constant ambient temperature, so that the light source controller can provide a more refined control of the light source output wavelength and spectrum. The light source controller may be particularly used for a light source in a fiber optic gyroscope.

34 Claims, 4 Drawing Sheets

LIGHT SOURCE CONTROL DEVICE

BACKGROUND

The invention pertains to the control of light sources, and particularly to light source excitation at various temperatures. More particularly, the invention pertains to broadband source start-up at nearly any temperature range for a fiber optic gyroscope.

Light sources may be maintained at a certain temperature by thermoelectric coolers, heaters or other temperature sustaining devices. For instance, a heated light source must achieve operational status relatively fast, such as within about 100 microseconds. However, the heater associated with the light source has a time constant of about one minute. This means that when the light source is turned on before the heater reaches its steady state temperature, the light source can be damaged. If the light source is not damaged because of turn-on before the correct temperature is achieved, then the spectrum of the source may become significantly narrowed such that the gyroscope, which the light source is a part of, will have large rotation rate detection errors.

SUMMARY OF THE INVENTION

The current and the power of the light source are kept at appropriate levels with an adjustable current source and a system processor (CPU) which is used in the loop with a look-up table. The table provides a light source input current setting as a function of temperature of the light source environment. A heater may be situated proximate to the light source. Since the time constant of the heater is long, that is one to two minutes, relative to the needed sampling time, for example, one second updates, the loop can easily maintain the luminous power level desired out of the light source loop. During the turn-on transient, the wavelength of the source will vary with the source current and temperature. This means that the system needs some sort of characterization before achieving steady-state operation. After the steady state is reached, the current to the light source will be still controlled to provide a more refinely controlled wavelength of the source output. The compensated light source is useful in a fiber optic gyroscope since rotational detection error may occur as a result of an uncompensated light source.

U.S. Patent No. 5,410,515 by Bielas, et al., issued Apr. 25, 1995, and entitled "Rapid Turn-on Source for Fiber Optic Gyroscope," discloses a light source having wavelength compensation, which is hereby incorporated by reference. The light source is driven by a source, control circuit that generates a signal that is representative of the temperature of the light source. This signal compensates the wavelength of the source light relative to temperature. A scale factor for the fiber optic rotation sensor is also generated as a function of the compensation signal of the light source. A corrected scale factor signal may also be computer generated from an algorithm or from a look-up table. The referenced patent does not disclose a look-up table or the like for temperature compensation of the light source power or input current of a broadband light source over any startup temperature, for a fiber optic gyroscope, like the present invention.

DESCRIPTION OF THE EMBODIMENTS

Figure 1:
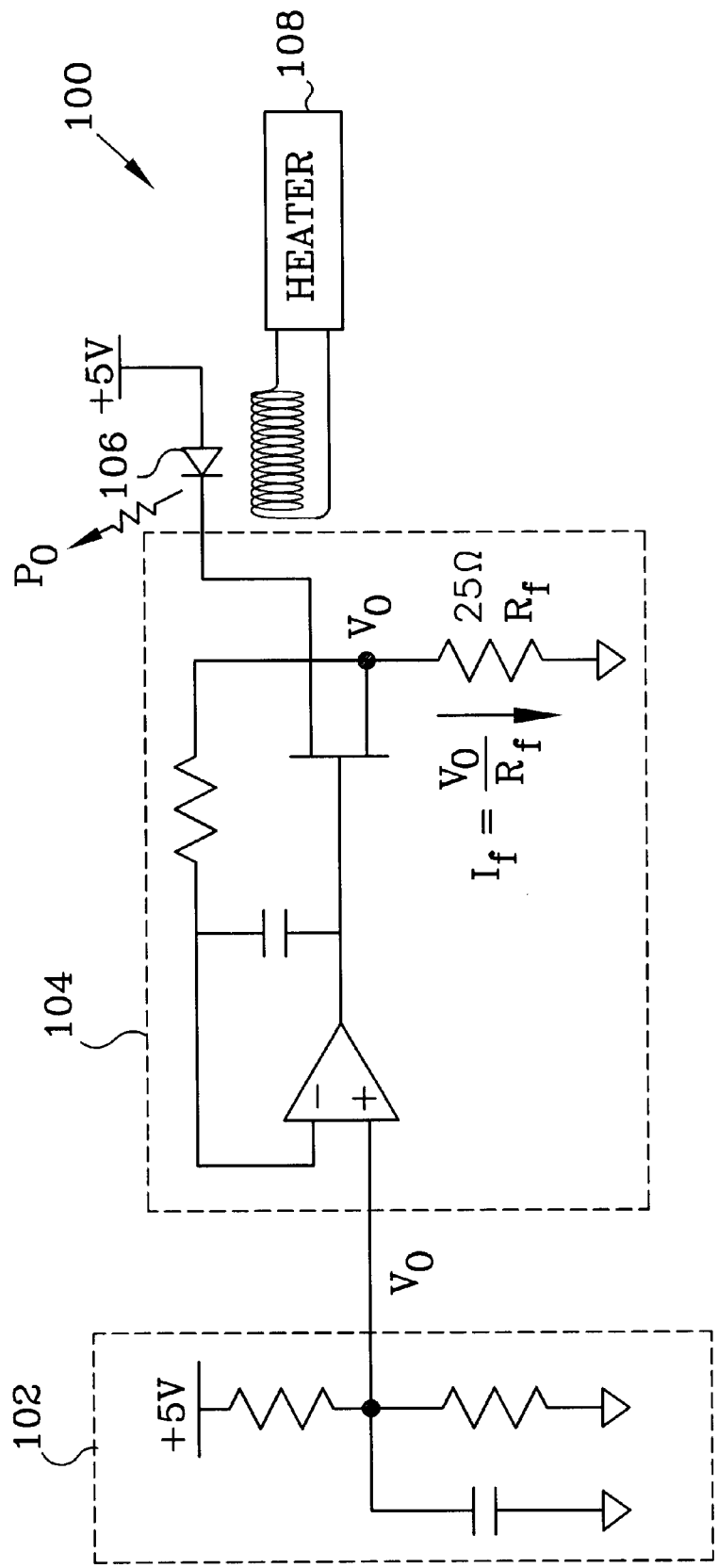
FIG. 1 is a diagram of a related art light source.

FIG. 1 shows a prior art light source 100 that includes a voltage source 102 for providing an input $V_0$ to an operational amplifier of a source driver 104. Source driver 104 forces the input $V_o$ to be the output of source driver 104 and drives laser diode 106 having a power output $P_0$ with a drive current $I_F$ substantially equal to $V_0/R_F$. A heater 108 attempts to stabilize laser diode 106 at a particular temperature. Often, a thermoelectric cooler is used to stabilize the temperature. Likewise if the diode is hot at turn-on, a cooler stabilizes the temperature.

Figure 2:
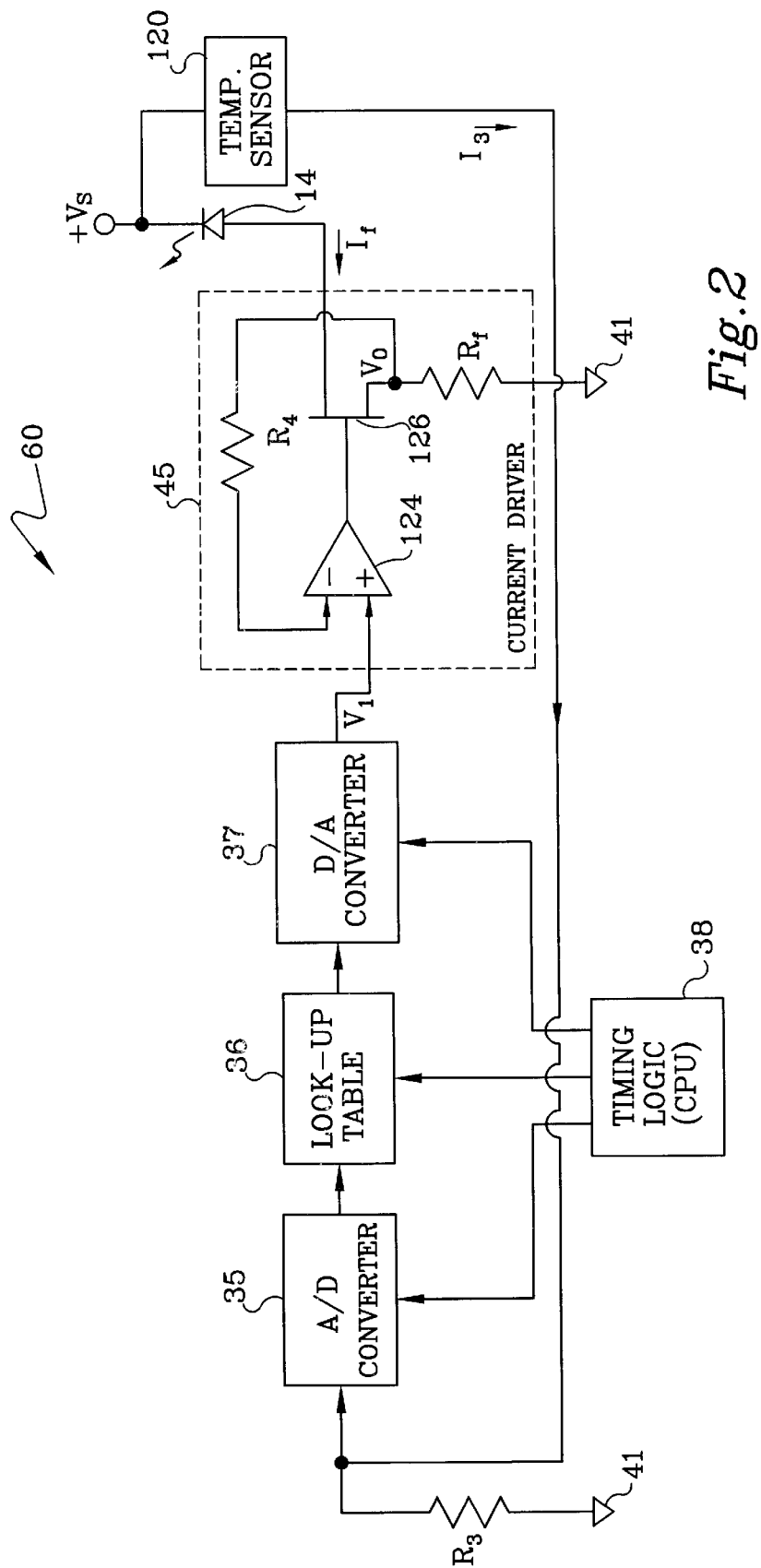
FIG. 2 shows a heated light source, which is temperature compensated with a look-up table.

FIG. 2 reveals an embodiment 60 of the invention for controlling a laser or light emitting diode 14 current over a wide range of temperatures. When light diode 14 is turned on with the application of plus five volts or so at terminal $V_s$; shortly afterwards the other circuitry of source 60 is powered up. Temperature sensor 120 already provides a current $I_3$ to resistor $R_3$ and A/D converter 35, which is indicative of the temperature of diode 14. A/D converter 35 transforms the current signal, which is revealed as a voltage across $R_3$, to a digital representation of the temperature of diode 14. The digital representation is applied to look-up table 36 which contains various values of voltage that are needed to control the current of diode 14 so that it has optimum output light at various temperatures of diode 14 over a wide range of temperature. Look-up table 36 may be programmed for the best correlating values of diode 14 temperature and current. The digital output of look-up table 36 is converted to an analog signal $V_1$ by digital-to-analog (D/A) converter 37. The functions of A/D converter 35, look-up table 36 and D/A converter 37 are coordinated by timing logic or central processor unit (CPU) 38.

The output of D/A converter 37 is a voltage $V_1$ that is applied to the non-inverting input of operational amplifier 124. The output of amplifier 124 is applied to the gate of an N-channel power FET 126. The drain of FET 126 is connected to the cathode of diode 14 and the source is connected to resistor $R_f$ that in turn is connected to ground 41. The source of FET 126 is also connected to a feedback resistor $R_4$ that in turn is connected to an inverting input of amplifier 124. Amplifier 124, FET 126 and resistors $R_f$ and $R_4$ constitute a current driver 45 for diode 14. If or diode 14 drive current is controlled by $V_o$ wherein $$I_f = \frac{V_o}{R_f}.$$

The feedback current through $R_4$ is negligible. $V_o$ may be equal to or a constant ratio of $V_1$. Amplifier 124 and FET 126 act as a voltage follower between the non-inverting input of amplifier 124 and the source of FET 126. $R_3$ may not be present as it provides a voltage for A/D converter 35 although converter 35 may have an internal input resistance through which current $I_3$ passes, resulting in a voltage level at the converter 35 input.

Operational amplifier 124 may have a resistor from the non-inverting input to ground 41. D/A converter 37 may have an internal input resistance to provide a particular voltage $V_1$ for a given current output of converter 37. In either case, the function of devices 12 and 60 remains the same. Devices 12 and 60 control the power of diode 14 while the temperature of diode 14 is changing, or while the heater or thermoelectric cooler 44 is coming up to normal operation in device 12.

Figure 3:
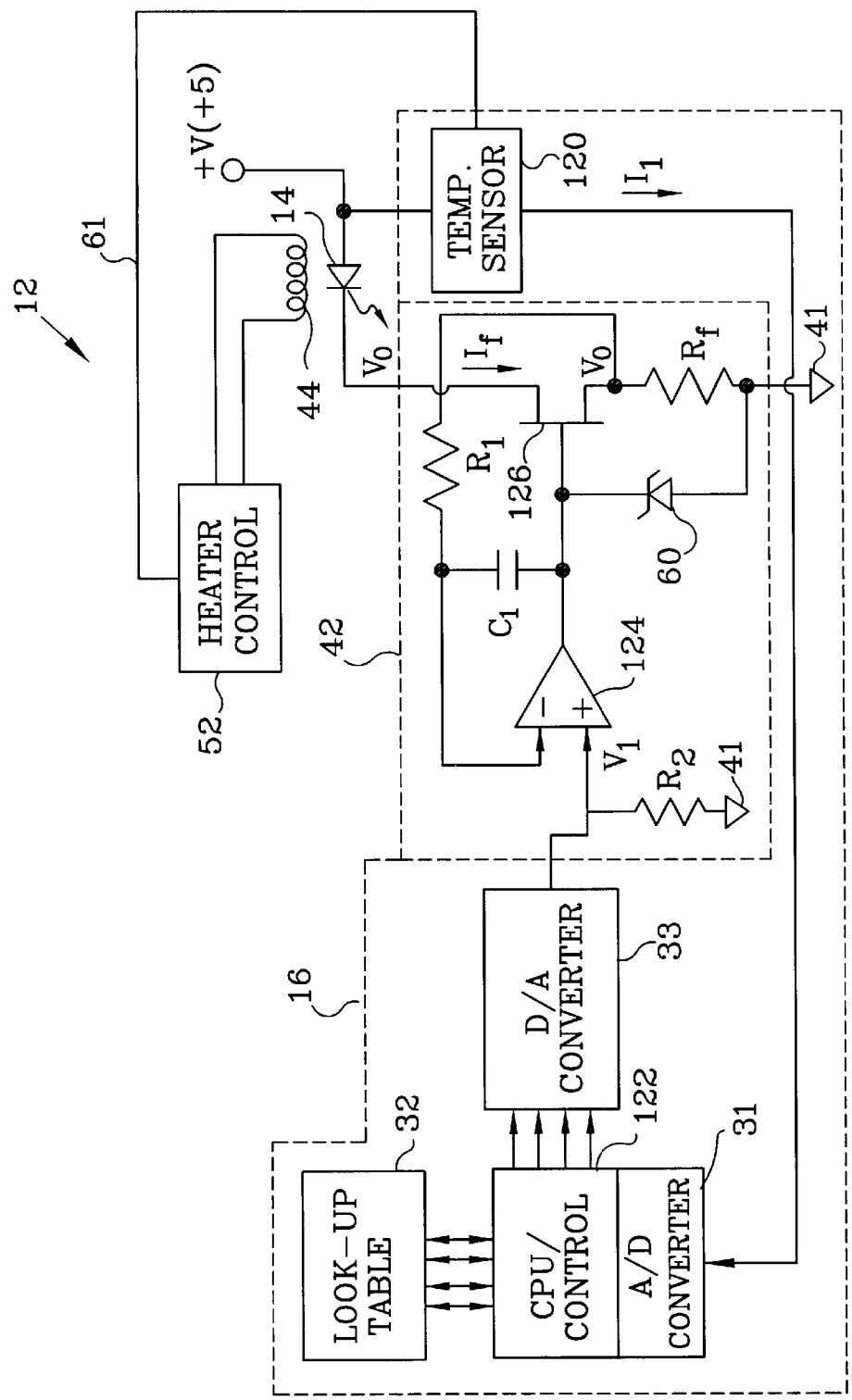
FIG. 3 shows an unheated light source, which is temperature compensated with a look-up table.

FIG. 3 shows a rapid turn-on light source 12 in accordance with the present invention. Rapid turn-on light source 12 includes temperature and current control circuitry 16, current source 42, laser diode 14, and heater (or cooler) 44. Temperature and current control circuitry 16 controls current to operational amplifier 124 by generating a voltage $V_0$ for input to amplifier 124. Light source driver 42 forces $V_o$ to appear at the output of driver 42 resulting in a current $I_f$ to drive laser diode 14.

Circuitry 42 includes a temperature sensor 120, for example, an AD590 temperature sensor, which is in thermal contact with laser diode 14 to measure the temperature of laser diode 14 as it heats up or cools down due to heater or cooler 44 and/or its self-heating power. Heater or cooler 44 is intended to contribute to temperature stability of the system; however, in lower performance systems the heater or cooler may not be essential as light source 12 can allow the temperature of diode 14 to float over some predetermined temperature range within some tolerated level of performance degradation. The AD590 temperature sensor, available from Analog Devices, Inc., Norwood, Mass. 02062, is close to an ideal current source and a current $I_1$ is generated upon excitation of light source 12 almost immediately upon turn-on. One skilled in the art will recognize that any current source, which approximates the functioning of the AD590 temperature sensor, can be used to sense the temperature of laser diode 14 and produce a signal in accordance therewith.

Current $I_1$ flows through and is sunk in the input impedance of an A/D converter 31 that is connected to CPU/control device 122. Current $I_1$ serves to set the voltage $V_0$ as a function of temperature. The variation of temperature sensor current $I_1$ is such that the voltage $V_0$ is lower when the device is cooler and higher when the device is hotter. $V_0$ is a function of $I_1$ in accordance with look-up table 32, and wherein temperature sensor current $I_1$ is a function of the temperature $T_s$ of laser diode 14. Table 32 has a listing of various temperatures, and corresponding to each temperature is a listed value of current that is to be applied to the light source for the respective temperature. Note that the look-up table 32 in FIG. 3 may also consist of an algorithm, such as a polynomial or other non-linear mathematical function, to perform the light source control function. Someone skilled in the field will recognize that changing this in no way changes the nature of the invention.

Voltage $V_0$ from D/A converter 33 is applied to the source driver 42 at a non-inverting input of operational amplifier 124. The source driver 42 includes a power field effect transistor (FET) 126 having its gate connected to an output of operational amplifier 124 and its drain and source connected to laser diode 14 and ground 41 through resistor $R_f$, respectively. Source driver 42 forces voltage $V_0$ to appear at the output of power FET 126 and across resistor $R_f$. Feedback from the source by way of the resistor $R_1$ and capacitor $C_1$, enforces such a desired output. The source driver 42 drives the laser diode 14 with a source drive current $I_f$ equal to $V_0/R_f$.

In prior art light sources when the source is cold, transient voltages or high currents at startup may damage the source circuitry. Rapid turn-on light source 12 of the present invention has source drive current $I_f$ equal to $V_0/R_f$ at turn-on because the AD590 temperature sensor 120 is extremely fast and temperature sensor current $I_1$ is sunk in A/D device 31 before the set voltage $V_0$ reaches, for instance, –0.54 volts. As such, damaging currents can be avoided by appropriate selection of the input impedance of device 31 to keep the source drive current $I_f$ from exceeding the maximum rated $I_f$ for the laser diode 14. Zener diode 60 limits the voltage output of amplifier 124 to prevent a sudden, excessive current $I_f$. $V_0$ for various values of $I_1$ is calculated and a look-up table 32 is utilized, which implies that an algorithm can also be utilized for selecting the proper $V_0$ to amplifier 124 in accordance with $I_1$.

It should be readily apparent that heater 44 could be a thermal foil heater. In addition, one skilled in the art will recognize that a thermo-electric cooler can also be utilized as device 44 to stabilize the temperature of laser diode 14. The heater and/or cooler may utilize a feedback 61 for control thereof.

Laser 14 and temperature sensor 120 may be connected to a supply voltage $V_s$ of +5 volts.

Voltage $V_1$ is applied to operational amplifier 124, which is configured as a voltage follower, resulting in $V_0$ to appear at the output of power FET 126 where $V_o = V_1$. FET 126 can be an IRFR9020. Feedback of $V_0$ to the inverting input of operational amplifier 124 is provided via fifteen thousand-ohm (K) resistor RI and 8200 picofarad (pf) capacitor $C_2$. The 8200 pf capacitor could also be positioned across the 15K resistor. $R_f$ and $R_2$ are adjusted accordingly.

The heater or cooler control or driver 52 could be similar to the source driver 42. A bi-polar transistor circuit or other kind of device may be used in lieu of a FET circuit, without changing the nature of the invention.

Figure 4:
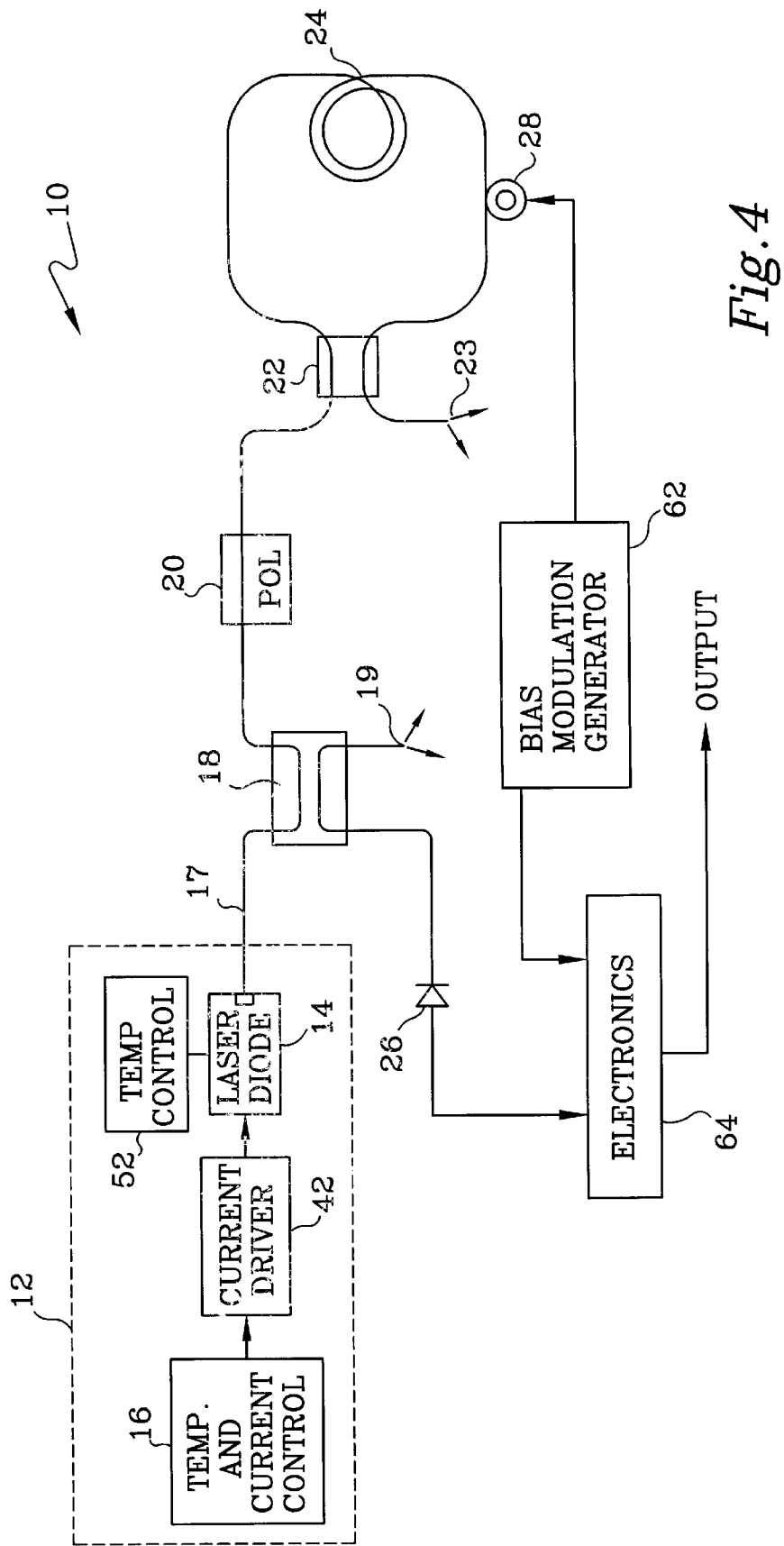
FIG. 4 shows an application of the light source to a fiber optic gyroscope.

A rapid turn-on light source 12 or 60 in accordance with the present invention is shown in FIG. 4 as the light source for a fiber optic gyroscope 10. Rapid turn-on light source 12 includes temperature and current controlled circuitry 16, current driver 42 and possibly temperature control 52, for driving a laser diode 14 to introduce light into an optical fiber 17 of gyroscope 10. Light input to fiber 17 then propagate s to source coupler 18. Source coupler 18 couples a portion of the light to polarizer 20 while a portion of the light is lost through non-reflecting end 19 of coupler 18. The light propagates from polarizer 20 to loop coupler 22 where it is split into two counter-propagating waves for loop 24; the first wave propagating in a clockwise direction around a fiber loop 24 and the second wave propagating in a counterclockwise direction around fiber loop 24. Phase modulator 28 provides bias phase modulation from generator 62. After the waves have traversed fiber loop 24, they are recombined by coupler 22 to form an optical output signal which propagates from the coupler 22 to source coupler 18 with a portion of the optical output signal lost through non-reflecting end 23 of the loop coupler 22. A portion of the optical output signal is then coupled from source coupler 18 for propagation to detector 26. Detector 26 outputs an electrical signal, which is proportional to the intensity of the light impressed thereon by the optical output signal. The electrical signal goes to electronics 64 where it is demodulated with the bias phase modulation signal from generator 62. The output from electronics 64 indicates the rate of rotation by sensing loop 24.

Those skilled in the art will recognize that only preferred embodiments of the present invention have been disclosed herein, that other advantages may be found and realized, and various modifications may be suggested by those versed in the art. It should be understood that the embodiment shown herein can be altered and modified without departing from the true spirit and scope of the invention as defined in the accompanying claims.

What is claimed is:

1. A device for controlling current to a light source, comprising:
   a temperature sensor proximate to the light source;
   a current driver connected to the light source; and
   a look-up table connected to said temperature sensor and to said current driver.

2. The device of claim 1, further comprising:
   an analog-to-digital converter connected between said look-up table and said temperature sensor; and
   a digital-to-analog converter connected between said look-up table and said current driver.

3. The device of claim 1 wherein said look-up table indicates various current levels for the light source for various temperatures of the light source.

4. The device of claim 2, further comprising a timing circuit connected to said analog-to-digital converter, to said look-up table and to said digital-to-analog converter.

5. The device of claim 3 wherein said look-up table indicates various current levels in accordance with a list of values of current corresponding to a list of temperatures of the light source, for determining appropriate currents for the light source.

6. The device of claim 3 wherein said look-up table indicates various current levels for the light source, in accordance with a non-linear function for various temperatures of the light source.

7. A device for controlling current to a light source, comprising;
   a temperature sensor proximate to the light source,
   a current driver connected to the light source, wherein said current driver comprises:
      an amplifier connected to said digital to analogy converter, and
      a transistor connected to said amplifier and to the light source;
   a look-up table connected to said temperature sensor and to said current driver;
   an analog-to-digital converter connected between said look-up table and said temperature sensor;
   a digital-to-analog converter connected between said look-up table and said current driver; and
   a timing circuit connected to said analog-to-digital converter, to said look-up table and to said digital-to-analog converter.

8. The device of claim 7, wherein said look-up table indicates various current levels for the light source for various temperatures of the light source.

9. The device of claim 8, wherein said look-up table indicates various current levels in accordance with a list of values of current cot-responding to a list of temperatures of the light source, for determining appropriate currents for the light source.

10. The device of claim 8, wherein said look-up table indicates various current levels for the light source, in accordance with a non-linear function for various temperatures of the light source.

11. A light source controller comprising:
    sensing means for sensing temperature of a light source;
    driving means, connected to said sensing means, for providing current to the light source, wherein said driving means comprises an amplifier and a transistor; and
    table means, connected to said driving means, for determining an appropriate current for a sensed temperature of the light source.

12. The controller of claim 11 wherein said table means indicates various current levels in accordance with a list of values of current corresponding to a list of temperatures of the light source, for determining appropriate currents for the light source.

13. The controller device of claim 11 wherein said table means indicates various current levels in accordance with a non-linear function for various temperatures of the light source, for determining appropriate currents for the light source.

14. The controller of claim 12, further comprising:
    first conversion means, connected to said table means and to said sensing means, for converting analog signals to digital signals; and
    second conversion means, connected to said table means and to said driving means, for converting digital signals to analog signals.

15. The controller of claim 14, further comprising timing means, connected to said table means and to said first and second conversion means.

16. The controller of claim 15, wherein said amplifier is connected to said second conversion means, and wherein said transistor is connected to said amplifier and to the light source.

17. The controller of claim 16, wherein:
    said amplifier is an operational amplifier having a non-inverting input connected to said second conversion means; and
    said transistor is a field effect transistor having a first terminal connected to an output of the operational amplifier, a second terminal connected to the light source, and a third terminal connected to an inverting input of the operational amplifier.

18. A method for controlling a current to a light source, comprising:
    1) determining a temperature of the light source;
    2) looking up the temperature in a listing of temperature values and corresponding current values and finding a corresponding current value associated with a value of the temperature of the light source; and
    3) providing a current to the light source that has a value of the corresponding to a temperature of the light source.

19. The method of claim 18 further comprising repeating the method of claim 18.

20. The method of claim 19 wherein said providing a current to the light source obtains a value of the current for a given temperature of the light source, from a list of values of currents corresponding to a list of temperatures, respectively.

21. The method of claim 19 wherein said providing a current to the light source, determines a value of the current for a given temperature of the light source, in accordance with a non-linear function.

22. A device for controlling current to a light source, comprising:
    a temperature sensor proximate to the light source, wherein the temperature sensor is operable to provide a signal indicative of a temperature of the light source;
    a variable current source connected to the light source; and
    a look-up table connected to said temperature sensor and said variable current sourced, wherein said look-up table receives a temperature indication of the light source from said temperature sensor and adjusts said variable current source for a particular current provided to the light source according to the temperature indication, and wherein said variable current source is adjusted during a temperature stabilization period.

23. The device of claim 22 further comprising:

a heater/cooler proximate to the light source; and a temperature controller connected to said heater/cooler and to said temperature sensor.

24. The device of claim 23, wherein:

said temperature sensor provides a signal indicative of a temperature of the light source, to said temperature controller; and said temperature controller provides a certain amount of power to said heater/cooler to result in affecting the temperature of the light source to a preset value.

25. A device for controlling current to a light source, comprising:

a temperature sensor proximate to the light source, wherein said temperature sensor a provides a signal indicative of a temperature of the light source;

a variable current source connected to the light source, wherein said variable current source provides a particular current to the light source according to the temperature of the light source during a period that the temperature of the light source is being stabilized by the heater/cooler upon turn-on of the light source;

a look-up table connected to said temperature sensor and said variable current source, wherein said look-up table receives a temperature indication of the light source from said temperature sensor and adjusts said variable current source for the particular current provided to the light source according to the temperature indication;

a heater/cooler proximate to the light source, wherein said particular current is provided during a period that the temperature of the light source is being stabilized by the heater/cooler upon turn-on of the light source; and a temperature controller connected to said heater/cooler and to said temperature sensor, wherein said temperature controller provides power to said heater/cooler to result in affecting the temperature of the light source to a preset value.

26. The device of claim 24, wherein said heater/cooler stabilizes the temperature of the light source upon turn-on of the light source, and wherein said variable current source provides the particular current to the light source during a period that the temperature of the light source has been stabilized.

27. The device of claim 25 wherein said variable current source provides the particular current to the light source according to the temperature of the light source during a period that the temperature of the light source has been stabilized.

28. The device of claim 23 wherein a wavelength of the light source is stabilized with the particular current to the light source according to the temperature of the light source.

29. The device of claim 27 wherein a wavelength of the light source is stabilized with the particular current to the light source according to the temperature of the light source.

30. A fiber optic gyroscope having a light source control device, comprising;

a light source;

a coupler connected to said light source;

a sensing loop connected to said coupler;

a detector connected to said coupler; and a light source control device, wherein said light source control device comprises:

a temperature sensor proximate to said light source;

a current driver connected to said light source wherein said current driver comprises an amplifier and a transistor; and a look-up table connected to said temperature sensor and said current driver.

31. The gyroscope of claim 30 wherein said look-up table receives a temperature indication of said light source from said temperature sensor and provides a signal to said current driver to provide a certain current to said light source to result in a constant wavelength or spectrum in the output of said light source over various temperatures of said light source.

32. The gyroscope device of claim 31 wherein said look-up table indicates various current levels in accordance with a list of values of current corresponding to a list of temperatures of said light source for determining appropriate currents for said light source.

33. The device gyroscope of claim 31 wherein said table means indicates various current levels in accordance with a non-linear function for various temperatures of said light source.

34. The gyroscope of claim 31 further comprising:

a heater/cooler proximate to said light source; and a heater/cooler controller connected to said temperature sensor and to said heater/cooler.

* * * * *